United States Patent [19]
Bard et al.

[11] Patent Number: 5,192,394
[45] Date of Patent: Mar. 9, 1993

[54] FLUID TREATMENT APPARATUS AND METHOD

[75] Inventors: Steven L. Bard, Endwell; Jeffrey D. Jones, Newark Valley, both of N.Y.

[73] Assignee: International Business Machines Corporation, Armonk, N.Y.

[21] Appl. No.: 808,134

[22] Filed: Dec. 16, 1991

[51] Int. Cl.$^5$ .......................... B44C 1/22; C23F 1/00
[52] U.S. Cl. .................... 156/640; 156/345; 156/659.1; 156/902
[58] Field of Search .................. 156/640, 656, 659.1, 156/664, 666, 902, 345; 134/32, 151, 198

[56] References Cited

U.S. PATENT DOCUMENTS

| | | | |
|---|---|---|---|
| 771,340 | 10/1904 | Van Housen et al. | 156/345 |
| 1,188,870 | 6/1916 | Williamson | 156/345 |
| 2,417,179 | 3/1947 | Ross | 156/345 |
| 3,350,248 | 10/1967 | Demarest, Jr. et al. | 156/663 |
| 3,502,519 | 3/1970 | White | 156/644 |
| 4,555,302 | 11/1985 | Urbanik | 156/637 |
| 4,557,785 | 12/1985 | Ohkuma | 156/345 |
| 4,999,079 | 3/1991 | Ash | 156/345 |
| 5,002,627 | 3/1991 | Scheithauer et al. | 156/345 |

FOREIGN PATENT DOCUMENTS 1201491 8/1989 Japan .

OTHER PUBLICATIONS

IBM Technical Disclosure Bulletin vol. 18, No. 3, (Aug. 1975), "Cascading Image Developer", by Ludden.
IBM Technical Disclosure Bulletin vol. 11, No. 11, (Apr. 1969), "Multistage Rinse Tank", by Davis.
IBM Technical Disclosure Bulletin vol. 23, No. 4, (Sep. 1980), "Spray Unit", by Gagne.
IBM Technical Disclosure Bulletin vol. 14, No. 9, (Feb. 1972), "Spray Etch Apparatus", by Antoci et al.
Journal Electrochemical Society, vol. 137, No. 10 (Oct., 1990), pp. 3086-3093, "Local Mass Transfer Coefficients at Walls Impinged by Unsubmerged Multijets Issued from Very Porous Distributors", by A. Bensmaili et al.

Primary Examiner—William A. Powell
Attorney, Agent, or Firm—Lawrence R. Fraley

[57] ABSTRACT

A fluid treatment apparatus and method wherein uniform treatment of a substrate (e.g., a thin, metallic sheet) is treated (e.g., etched) during movement thereof. This treatment involves directing a plurality of fluid jets through a collected first fluid onto one of the substrate's surfaces in such a manner that the fluid of each fluid jet will engage (collide with) the fluid from the nearest fluid jet as a result of being maintained across the substrate's surface at a predetermined velocity prior to mixing of the jets with surrounding fluid. Prevention of such mixing prior to such engagement has proven to assure uniform treatment of the substrate. In one aspect of the invention, fluid is directed onto opposite surfaces of the substrate in this fashion, the fluid from the lower surface, however, being passed through air or similar ambient and thus prevented from mixing therewith prior to such engagement.

33 Claims, 4 Drawing Sheets

FLUID TREATMENT APPARATUS AND METHOD

TECHNICAL FIELD

The invention relates to fluid treatment apparatus and methods for treating substrates or the like. As defined herein, the invention is particularly adapted for etching metallic substrates such as might be utilized as circuit members in information handling systems (computers).

CROSS-REFERENCE TO CO-PENDING APPLICATIONS

In Ser. No. 07/696,435, entitled "Method Of Making Flexible Circuit Member" (Inventors: S. Albrechta et al), filed May 6, 1991, now U.S. Pat. No. 5,145,553, there is defined a method of making a flexible circuit member wherein a composite structure (including a dielectric layer surrounded by two conductive elements, one being copper and the other stainless steel) are simultaneously etched using a cupric chloride etchant solution to effectively remove desired portions of these metallic materials and produce a circuit member possessing desired flexibility.

In Ser. No. 07/554,487, entitled "Fluid Treatment Device" (Inventors: S. Bard et al), filed Jul. 19, 1990, now U.S. Pat. No. 5,063,951, there is defined a fluid treatment device wherein opposed, movable head members are utilized each for directing a first fluid (e.g., an etchant) at an established first pressure against a substrate and means for directing a second fluid (e.g., air) at an established second pressure equal to or greater than the first pressure against the substrate in the area proximate the first fluid so as to substantially contain and limit the first fluid to impingement substantially only at a precise location on the substrate against which the first fluid impinges. Both head members are movable relative to each other during fluid application while still maintaining precise first fluid impingement on designated substrate locations. Ser. No. 07/554,487 is now U.S. Pat. No. 5,063,951.

BACKGROUND OF THE INVENTION

Several apparatus and methods for fluid treating various substrate elements and similar articles are known in the art, with examples being shown and described in U.S. Pat. Nos. 4,555,302 (Urbanik), 4,999,079 (Ash), 4,557,785 (Ohkuma), 3,502,519 (White) and 5,002,627 (Scheithauer et al). See also International Business Machines Corporation Technical Disclosure Bulletins Vol. 18, No. 3 August, 1975 at pages 690 and 691, Vol. 11, No. 11, April, 1969 at page 1536, Vol. 23, No. 4, September, 1980, at pages 1362 and 1363 and Vol. 14, No. 9, February, 1972, at pages 2605 and 2606. Various apparatus and methods are shown and described in these publications as being capable of providing several different forms of treatment for the article being so treated including, for example, coating, cleaning, rinsing and chemically reacting (e.g., etching). Accordingly, by the term fluid treatment as used herein is meant to describe a capability of the invention to provide any of the aforementioned functions (coating, cleaning and chemically reacting) as well as others such as plating, etc. which are discernible from the teachings herein. By the term fluid as used herein is meant to include both liquids (e.g., etchants) and gases (e.g., air). As defined, the present invention is particularly adapted for etching relatively thin metallic substrates, which substrates may be eventually used as elements of a circuitized substrate member or the like for use in an information handling system (computer) environment. It is understood, however, that the invention is not limited to this particular application, as it can be readily used in several other applications, such as coating, plating, etc. as mentioned above.

As defined herein, the invention is designed for applying fluid to at least one surface of a substrate using a plurality of fluid nozzles located adjacent this surface for directing a first fluid through a quantity of collected said fluid onto designated, spaced locations of the substrate. The fluid jets from these fluid nozzles impinge on the designated areas and pass across the substrate's surface with sufficient velocity so as to substantially prevent mixing of these jets with the adjacent collected fluid prior to engagement with the oncoming fluid from the nearest, adjacent fluid jet. By maintaining these sufficient velocities of impinging fluid jets at selected areas of the substrate being treated, uniform treatment (e.g., etching) is achieved. Such uniformity is considered essential in many substrates such as defined above. The invention also defines a means whereby this same substrate may be treated on an opposite, second surface thereof, again using a plurality of directed fluid jets to impinge on this second surface and maintain substantial velocities to prevent mixing of the fluid jets on the substrate's other surface, this time, however, with the ambient (e.g., air) located about these second jets. Accordingly, these second fluid jets may or may not be passed through a collected liquid such as an etchant or the like, but instead may simply be oriented adjacent this second surface and thus surrounded by the aforementioned ambient. The invention, as understood from the following description, is operational in a relatively simple manner and, additionally, is relatively inexpensive to produce and utilize while still assuring precisioned treatment of the selected articles.

It is believed that a fluid treatment apparatus and method possessing the several advantageous features defined herein and otherwise discernible from the instant teachings would constitute a significant advancement in the art.

DISCLOSURE OF THE INVENTION

It is, therefore, a primary object of the present invention to enhance the art of fluid treatment apparatus and methods.

It is another object of the invention to provide a fluid treatment apparatus and method capable of precisely directing fluid jets onto at least one surface of a substrate being treated to assure uniform treatment thereof, such treatment deemed essential in the highly precise environment of information handling systems.

It is another object of the invention to provide such an apparatus and method which can be operated in a relatively simple manner and yet produce relatively inexpensively.

In accordance with one aspect of the invention, there is defined a fluid treatment apparatus which comprises means for moving a substrate in a predetermined direction of travel, dam means located substantially adjacent a first surface of this moving substrate for the purpose of collecting and maintaining a first fluid at a predetermined level above the substrate's first surface, a plurality of fluid nozzles positioned adjacent the first surface and below the level of the collected first fluid to direct a plurality of fluid jets of this first fluid through the collected first fluid and onto the substrate's first surface at designated, spaced-apart locations. Selected ones of the fluid nozzles are spaced apart from the nearest, adjacent fluid nozzle such that the fluid jets from these selected ones maintain a sufficient velocity across the first surface so as to substantially prevent mixing thereof with the collected first fluid prior to engagement by said directed fluid jets with the directed fluid jet from the nearest, adjacent fluid nozzle. This apparatus further includes means for providing the first fluid at a pressure sufficient to maintain the fluid jets at the required velocity across the substrate's first surface.

In accordance with another aspect of the invention, there is provided a method of fluid treating a substrate wherein the method comprises the steps of moving the substrate in a predetermined direction of travel, collecting a first fluid substantially adjacent the moving substrate's first surface and maintaining this collected first fluid at a predetermined level above the first surface, and directing a plurality of fluid jets of this first fluid through the collected first fluid onto the moving substrate's first surface at designated, spaced-apart locations thereon in a such a manner that each of these directed fluid jets maintains a sufficient velocity across the first surface to prevent mixing thereof with the collected first fluid prior to engagement with oncoming fluid from the nearest adjacent fluid jet. The method further comprises the step of providing the described first fluid at a pressure sufficient to maintain the fluid jet velocities needed.

BEST MODE FOR CARRYING OUT THE INVENTION

For a better understanding of the present invention, together with other and further objects, advantages and the capabilities thereof, reference is made to the following disclosure and appended claims in connection with the above described drawings.

Figure 1:
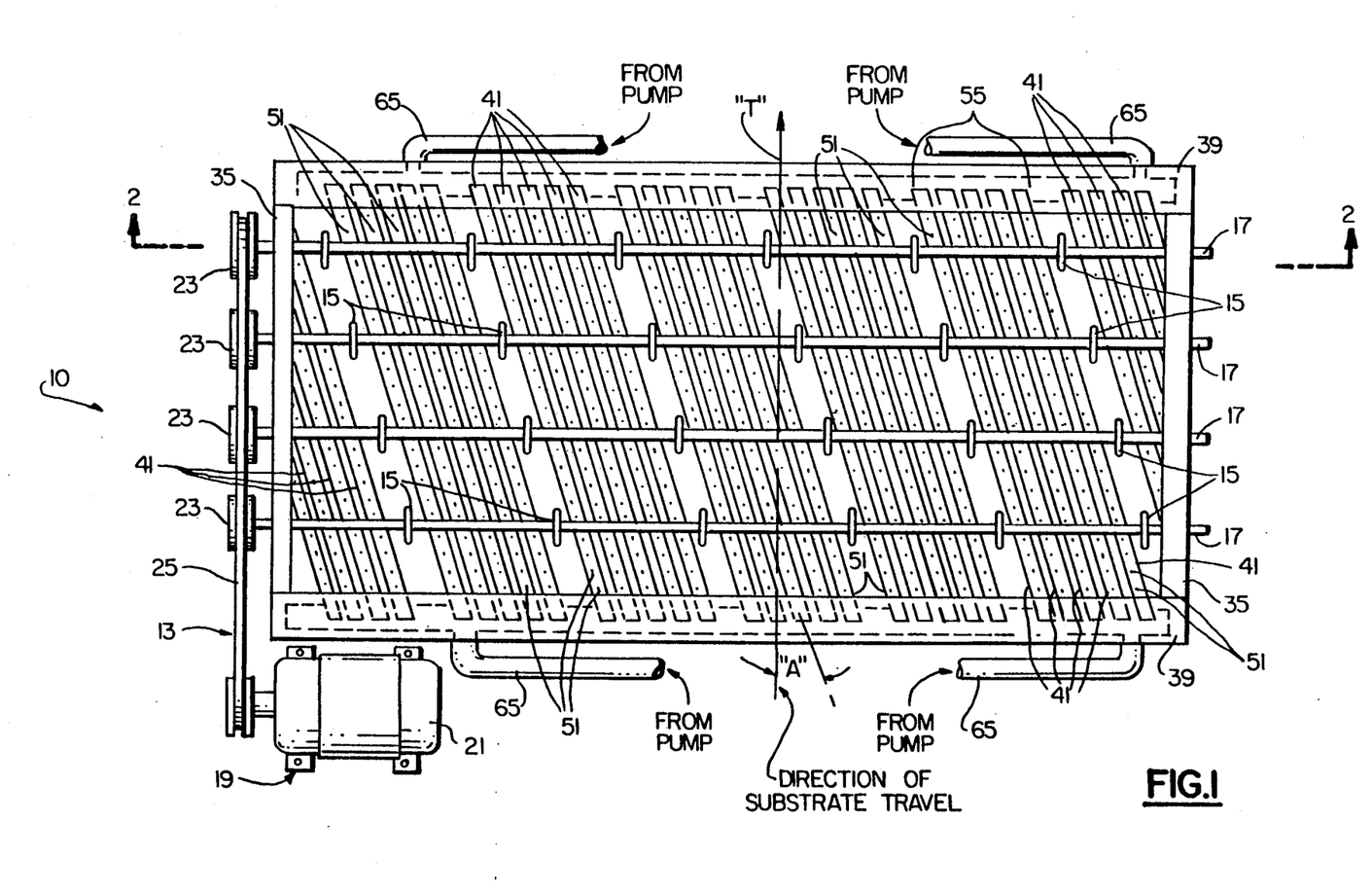
FIG. 1 is a plan view of a fluid treatment apparatus in accordance with one embodiment of the invention, said FIG. 1 taken along the line 1—1 in FIG. 2.
Figure 2:
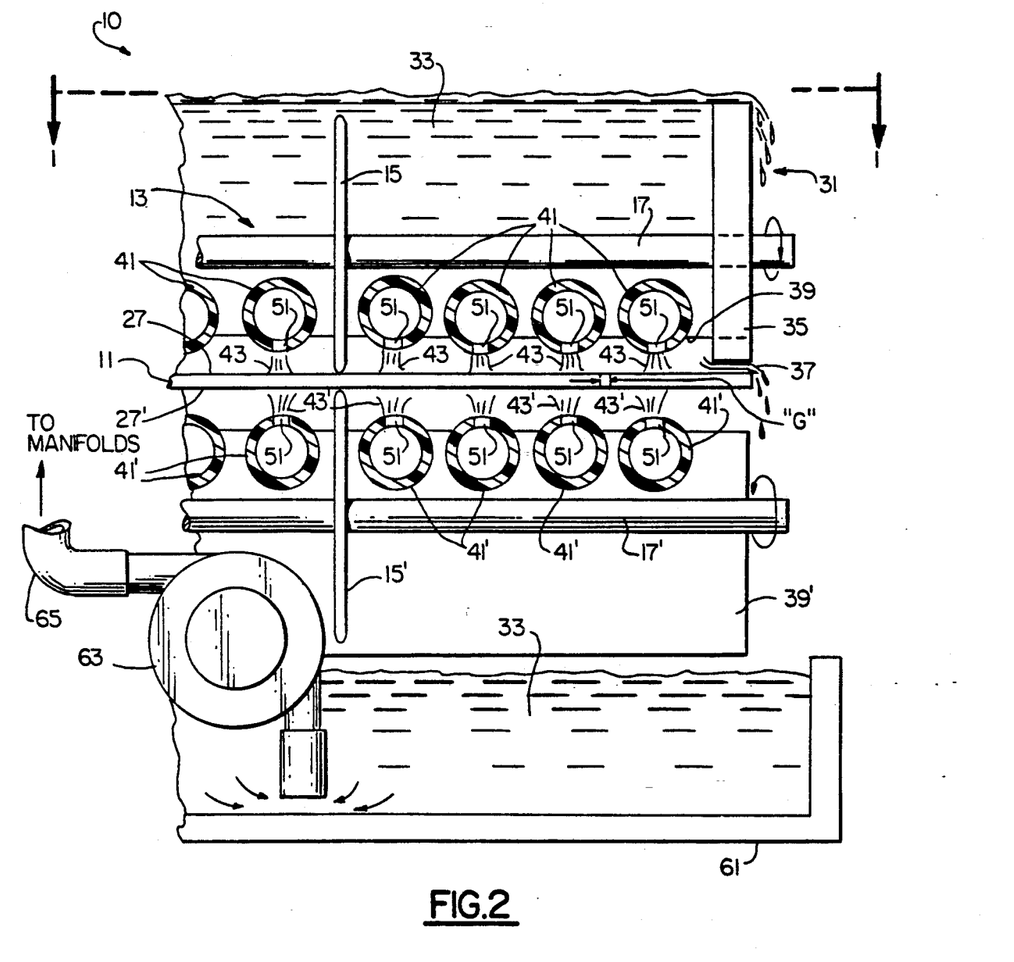
FIG. 2 is a side-elevational view, partly in section and on a much enlarged scale over the view of FIG. 1, as taken along the line 2—2 in FIG. 1, but representing only a portion of the overall apparatus illustrated in FIG. 1.

In FIGS. 1 and 2, there is shown a fluid treatment apparatus 10 in accordance with the preferred embodiment of the invention. Apparatus 10 is designed for treating a substrate 11 (FIG. 2) as this substrate moves therethrough. In one example of the invention, substrate 11 comprised a thin composite member, including as part thereof, a thin layer of copper. In one example, the composite had an overall thickness of about 0.060 inch and the copper had a thickness of about 0.0024 inch. Two layers of copper, one on each side, were used. In other examples, substrates as thin as about 0.005 inch were successfully treated. Substrate 11 is not shown in FIG. 1, for illustration purposes. Apparatus 10 includes means 13 for moving substrate 11 through apparatus 10, a preferred embodiment of means 13 including a plurality of rollers 15 spacedly located on a corresponding plurality of elongated shafts 17 which, as shown in FIG. 1, are substantially parallel to one another. In one embodiment, each shaft 17 included a total of six such rollers 15, spaced apart at a distance of about 3.75 inches from an adjacent roller. Drive means 19, illustratively represented by an electric motor 21 mechanically coupled to individual pulleys 23 at the end of each shaft 17, may be used to provide shaft rotation as desired. The use of an electric motor and such pulleys, including a common belt 25, is understandably provided for illustrative purposes and not meant to limit the invention in that several other means may be successfully utilized.

Figure 3:
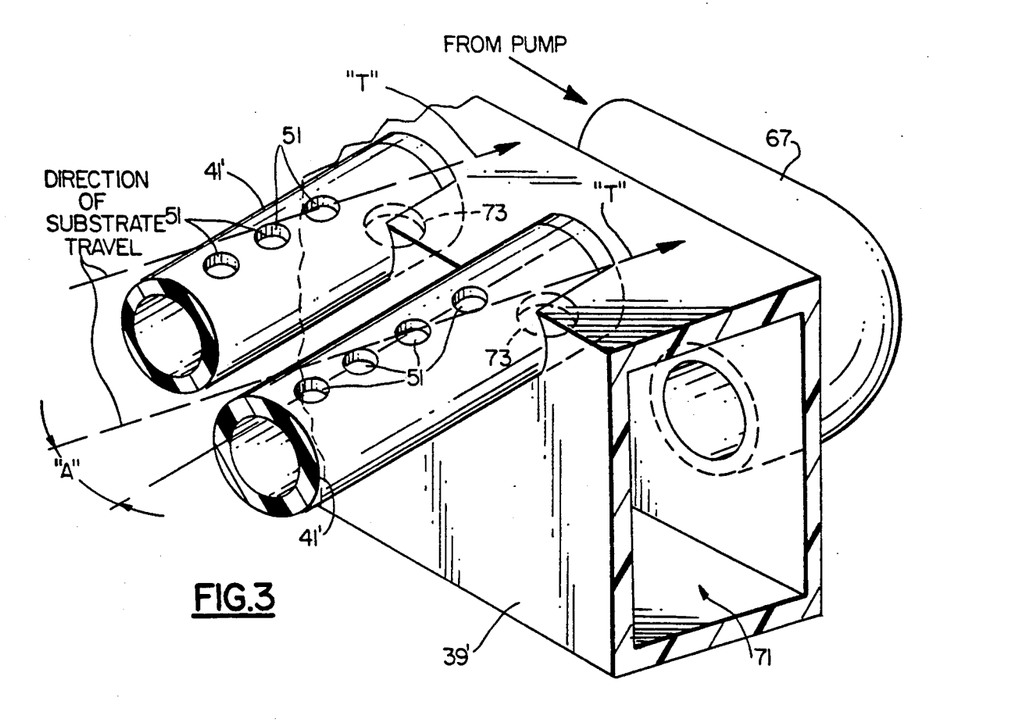
FIG. 3 is a partial, perspective view of two fluid nozzle structures and associated manifold for use in the invention, in accordance with one embodiment thereof, FIG. 3 being of a much enlarged scale over the view of FIG. 2.

As shown in FIG. 2, each of the rollers 15 located within the upper portion of apparatus 10 physically engages an upper, first surface 27 of substrate 11 to effect movement of the substrate in a predetermined direction of travel (illustrated by the arrow "T" in FIG. 1). This direction is also illustrated in FIG. 3. In FIG. 2, it is understood that this direction of travel is perpendicular to the figure and away from the viewer. As also shown in FIG. 2, apparatus 10 further includes a second plurality of rollers 15' spacedly located on individual shafts 17' located below substrate 11 and thus in such an arrangement that each of the rollers 15' is designed for physically engaging a lower, opposing second surface 27' of substrate 11. In a preferred embodiment of the invention, rollers 15 and 15' engage the respective surfaces 27 and 27' directly opposite each other, as also seen in FIG. 2. Each roller 15 and 15' is preferably comprised of hard rubber or similar material and located on shafts 17 and 17' of titanium. These materials are not meant to limit the invention, however, as other materials may be readily substituted therefor.

Apparatus 10 further includes dam means 31 located adjacent the first surface 27 of substrate 11 and designed for collecting a first fluid 33 and maintaining this first fluid at a predetermined level above surface 27. In a preferred embodiment of the invention, first fluid 33 comprised an etchant, which etchant was preferably a aqueous solution of cupric chloride. Of greater specificity, this preferred first fluid comprised of about 370 grams per liter (g/l) cupric chloride, about 106 g/l hydrochloric acid, and about 23 g/l cuprous chloride. This solution was preferably applied at a temperature of from about 110 to about 130 degrees Fahrenheit.

Dam means 31, as shown when comparing FIGS. 1 and 2, comprises a pair of upstanding sidewalls 35 (only one shown in FIG. 2) which, as shown in FIG. 2, are preferably vertically oriented along an outer edge of substrate 11. Preferably, each wall 35 is spaced a slight distance (e.g., 0.030 inch) above the upper surface 27 of substrate 11 to permit a predetermined amount of first fluid 33 escape. Such escaping fluid also provides a "fluid bearing" between the substrate and lower surface of wall 35. This spacing is represented by the numeral 37 in FIG. 2. As shown in FIG. 2, first fluid 33 is also caused to overflow the sidewalls 35, such overflow considered important for the purposes of the invention (described further below). In another embodiment, apparatus 10 was capable of treating two separate substrates in a simultaneous manner. One of these is preferably located internally (toward the center of apparatus 10) of the other such that the other is peripherally located thereabout. In such an arrangement, a small gap (e.g., about 0.030 inch) will exist between the two which may also permit minimal first fluid escape, said gap understandably located about the common boundary between both substrates. Such a gap is illustrated in phantom, in FIG. 2 (dimension "G").

Dam means 31 further includes a second pair of upstanding walls 39 which abut respective end portions of walls 35 in the manner shown in FIG. 1 to thereby define a total of four sidewalls for purposes of maintaining and collecting first fluid 33 above substrate 11. Understandably, the substantially solid substrate 11 thus serves as a bottom wall for this containment structure. In accordance with one aspect of the invention, the first fluid 33 was maintained at a level of about one inch above the planar, first surface 27 of substrate 11. As also further defined below, each of the sidewalls 39 also preferably serve as manifolds for receiving recirculated first fluid 33 and dispensing said fluid to the fluid nozzles (defined below) of the invention. Each sidewall 39 is thus preferably substantially hollow for this purpose and will be further described in greater detail below with the description of FIG. 3.

Apparatus 10 further includes a plurality of fluid nozzles 41 positioned substantially adjacent the upper, first surface 27 of substrate 11 and each designed for providing a plurality of fluid jets 43 (FIGS. 2 and 4) onto spaced-apart locations of the upper surface 27 of substrate 11. Each fluid nozzle 41 preferably comprises an elongated pipe which extends between the opposing, parallel manifolds 39 and is operatively coupled thereto at respective end portions thereof. This is best shown in the partial view of FIG. 3 for the similar elongated pipes which constitute the lower fluid nozzles 41' as may also be provided along the substrate's lower surface 27' if fluid treatment thereof is desired. Both nozzles 41 and 41' (FIG. 2) include a plurality of apertures 51 therein, arranged in a longitudinal pattern along each pipe as shown in FIG. 3, and also in FIG. 1 (the apertures in FIG. 1 understandably on a much smaller scale). In one embodiment of the invention, the pipe of each nozzle 41 and 41' possesses an overall length of about twelve inches and is comprised of a suitable plastic (e.g., polyvinylchloride). Each aperture 51 in pipes 41 and 41' is preferably of substantially cylindrical configuration (see especially FIG. 3) and, in one embodiment, possesses a diameter of only about 0.035 inch and is spacedly positioned from about 0.05 inch to about 0.70 inch from the nearest, adjacent aperture. It is understood that the apertures 51 represented in FIG. 1 are located on the undersurface of pipes 41 and thus are not facing the viewer in FIG. 1. This is also understood from the structures illustrated in FIGS. 2 and 4.

As best seen in FIG. 1, each of the pipes 41 is arranged in a respective grouping 55 (one shown in FIG. 1 by the numeral 55) such that a resulting plurality (e.g., seven) of such groupings results. Each grouping preferably comprises a total of four or five pipes, as also shown in FIG. 1. As stated, pipes 41 (and 41') are arranged parallel to each other within the respective upper or lower portions of apparatus 10. Accordingly, each grouping of such pipes is also substantially parallel to the nearest, adjacent such grouping. In a preferred embodiment of the invention, each grouping, including the several pipes therein, is oriented at an acute angle of from about ten degrees to about thirty degrees respective to the longitudinal direction of travel "T" of substrate 11. Greater angles are also acceptable. This acute angle is represented by the designation A in FIG. 3. This strategic positioning of pipes 41 and 41' and the respective apertures 51 therein assures, significantly, that the entire adjacent surface (27, 27') of substrate 11 being treated by the invention will receive directed fluid jets from the defined fluid nozzles and thus assure that uniform fluid application to these surfaces will occur. This represents a significant aspect of the invention in order to provide uniform treatment (e.g., etching) as is considered essential in the highly precise circuit technology art for circuit structures used in information handling systems.

As shown in FIG. 2, fluid jets (43, 43') are provided against both the upper and lower surfaces of substrate 11 and, preferably, on directly opposite sides thereof during substrate movement through apparatus 10. As further seen, each of the several elongated pipes 41 and 41' is operatively coupled to a pair of respective manifolds (39 for the upper part of apparatus 10 and 39' for the lower part thereof) in order to receive the desired fluids at appropriate pressures such that these fluids will pass through the provided apertures 51 within these pipes for direct impingement on the respective adjacent surface of substrate 11. In a preferred embodiment of the invention, each of the pipes was positioned at a distance of only about 0.060 inch from the respective adjacent surface receiving the fluid jet therefrom. This distance is represented by the letter "D" in FIG. 4. Reference "D" may range from about 0.065 inch to about 0.260 inch, when treating substrates of the type defined herein and using etchant solutions of the type also described. In this arrangement, the axis of each cylindrical aperture is represented by the letter "C" in FIG. 4 and is substantially perpendicular to the planar, adjacent surface of substrate 11.

As further seen in FIGS. 1 and 2, each of the defined rollers 15 is strategically positioned within a respective spacing provided between the adjacent groupings 55 of pipes 41 (this is similarly true for the rollers 15' relative to pipes 41' located in the lower portion of apparatus 10). In one embodiment of the invention, each grouping was spaced apart at a distance of about 0.625 inch so as to accommodate each roller 15. Significantly, this spacing and roller provision still enables effective, uniform fluid treatment for the respective surfaces of substrate 11.

In FIG. 2, there is shown a reservoir 61 located below the respective paired manifolds 39 and 39' for collecting the fluids impinged on substrate 11. Thus, in the embodiment of FIG. 2, it is understood that the first fluid (33) impinged on surface 27 will be the same as the second fluid impinged on the lower surface 27'. Both of these impinging fluids are thus collected by reservoir 61 for eventual recirculation (e.g., using a suitable pump 63 or the like) back to the respective manifolds (e.g., using suitable piping 65). Each manifold, as shown in FIG. 1, is preferably serviced by two such pipes 65, such that a total of eight such pipes are used for the four manifolds of the invention.

It is understood that the invention is not meant to be limited to the application of only one fluid to both, opposing surfaces of a substrate. That is, it is possible in the embodiment of FIG. 2 to provide separate collection means for the respective fluids impinged on opposite surfaces 27 and 27' and accordingly to provide separate recirculation means for each such fluid to the respective pair of manifolds serving the respective, dispensing fluid nozzles. The invention is thus not limited to a singular reservoir 61 or recirculation means 63 as illustrated in FIG. 2.

The described pump 63, used to recirculate and thus supply fluid to the respective parts of apparatus 10, thus assures that satisfactory pressure will be provided at the receiving manifolds and associated pipes in order to accomplish the objectives of the invention. In one embodiment of the invention, the pressure of the fluid at each of the four manifolds 39 and 39' preferably ranged from about four pounds per square inch (psi) to about twenty psi, when using the fluids and other dimensions (e.g., for apertures 51) defined herein. At such pressures, and using such etchant materials, the defined thin metallic substrate 11 was preferably moved in a substantially horizontal direction of travel through apparatus 10 at a rate of from about twenty inches per minute to about 140 inches per minute, resulting in a uniform etch rate of the copper substrate of about 0.0005 inches per minute to about 0.002 inches per minute.

In FIG. 3, there is shown a partial view, in perspective, of one of the two lower manifolds 39' for use with the present invention. It is understood that the manifold and coupled pipes which form this part of the invention are substantially similar in shape and arrangement to the corresponding manifolds 39 and elongated pipes which provide fluid to the upper surface 27 of substrate 11, excluding a pair of sidewalls such as used for the purpose of collecting fluid as is done in the upper part of apparatus 10. As seen in FIG. 2, fluid is not collected along the lower surface 27' of substrate 11 but instead the directed fluid jets 43' impinge on surface 27' and the impinged fluid thereafter caused to fall (by gravity) into reservoir 61 (or a suitable separate collection means if the fluid impinged on the substrate's lower surface is to be different from that of first fluid 33). Absent such walls for this lower manifold and pipe assembly will, understandably, require positioning of the elongated shafts 17' within some suitable supporting means, such support being provided for shafts 17 by the upper walls 35. Any suitable support means can be readily provided for shafts 17', including an upstanding bracket or the like from the sidewall of reservoir 61. Further definition is thus not believed necessary.

In FIG. 3, each of the pipes 41' is shown as including an end portion which extends within the respective manifold 39'. Accordingly, fluid from pump 63 is directed via piping 67 into the internal chamber 71 defined within the manifold and then into the contained end portions of each pipe 41' through an opening (73) provided therein. Importantly, this arrangement assures that fluid is provided to all of the contained pipes 41' within the lower part of apparatus 10 such that the fluid dispensed from each aperture 51 is directed onto the respective adjacent surface 27' at substantially the same pressure as jets applied in all other apertures from pipes 41'. Similarly, fluid applied to the upper surface 27' is also maintained at substantially identical pressures through each aperture 51 from the upper located elongated pipes 41. As stated above, this pressure is preferably within the range of from about four psi to about twenty psi.

Figure 4:
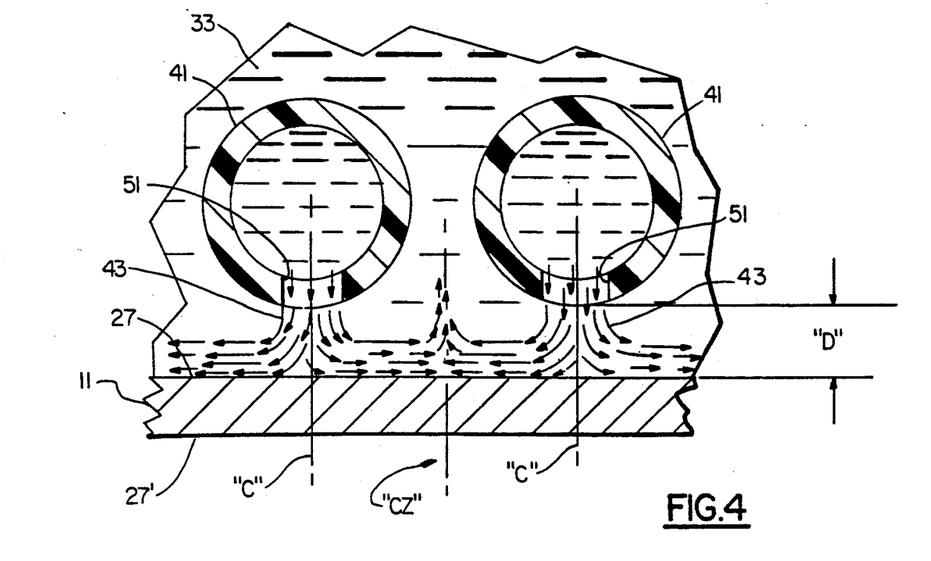
FIG. 4 is a partial, plan view, in section, of the fluid nozzles of the invention for directing the first fluid onto a first surface of the substrate being treated, this view better illustrating the fluid jets provided by these fluid nozzles.
Figure 5:
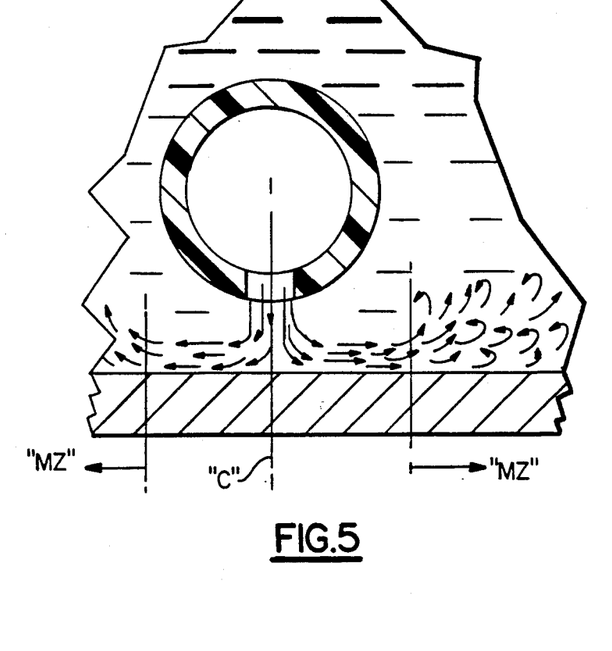
FIG. 5 is a partial, plan view, in section, illustrating a fluid nozzle and resulting fluid jet therefrom wherein mixing between the fluid jet and surrounding collected first fluid is allowed to occur.

In FIG. 4, two adjacent pipes 41 are shown for providing respective fluid jets 43 onto surface 27. In one embodiment, these pipes are spaced apart (center-to-center) from about 0.20 to about 1.00 inch. It is understood that the lower pipes 41' of the invention are similarly positioned relative to the respective lower surface 27' of substrate 11 but are not shown herein for illustration purposes. Significantly, the invention provides the means whereby the fluid jets 43 from pipes 41 (as well as the fluid jets 43 from lower pipes 41') are directed onto the respective, adjacent surface of substrate 11 at such a pressure and velocity so as to maintain a sufficient fluid velocity across the respective surface of the substrate so as to substantially prevent mixing between this directed fluid and the fluid surrounding these fluid jets prior to engagement with fluid from the nearest, adjacent such fluid nozzle. In the case of fluid jets directed onto upper surface 27', it is understood that this fluid is directed through contained fluid in such a fashion that mixing thereof does not occur until collision (or engagement) occurs between these adjacent fluid nozzles 41. Such a collision (or engagement) zone is represented by the line of demarcation "CZ" in FIG. 4. Subsequent to collision at this location, it is understood of course that the directed fluid jets 43 eventually mix with the surrounding, collected first fluid 33 held by walls 35 and manifolds 39. For fluid jets directed from the lower pipes 41', it is understood that in the embodiment as depicted herein, these pipes are located in air as the surrounding ambient and the fluid from the directed fluid jets thus falls into a collecting reservoir 61 located below. This does not occur, however, until collision occurs between adjacent fluid jets in a fashion similar to that illustrated in FIG. 4. This is also considered a significant aspect of the invention and, like the fluid direction described in FIG. 4, assures uniform fluid application across the entire, adjacent surface of the substrate to assure uniform treatment (e.g., etching) of the substrate. Understandably, this represents a significant aspect of the invention in that it has been determined that should mixing occur between the directed fluid jets and the surrounding, contained liquid (e.g., fluid 33) or ambient (e.g., air) prior to such engagement, that adequate, uniform treatment (e.g., etching) may not occur. As stated, such uniformity is considered essential when manufacturing highly precise articles such as circuit structures for use in information handling systems. An example of such mixing, prior to engagement with adjacent fluid jets, is illustrated in FIG. 5 wherein a directed fluid jet from an adjacent pipe is seen to mix with the surrounding fluid at a location (represented by the dimension "MZ" in FIG. 5) from the aperture's central axis "C". Understandably, the mixing illustrated in FIG. 5 is considered an undesirable occurrence which, significantly, is overcome by the teachings of the present invention.

In one embodiment of the invention, using the fluids and pressures described above, it was determined that each fluid jet 43 traveled across the adjacent, respective surface of substrate 11 at a rate of from about twenty-three inches per second to about 500 inches per second, such location of horizontal travel understandably occurring in a horizontal manner within a zone between the approximate location of direct, vertical fluid impingement (at axis "C") and the point or zone of collision "CZ".

As stated, apparatus 10 is particularly suited to serve as an etcher for etching metallic or similar substrates using appropriate etchants (e.g., cupric chloride). Apparatus 10 can also be readily utilized to perform other functions and is thus not limited to use as an etcher. For example, apparatus 10 may be used to provide rinsing (e.g., using water) of etched or coated substrates to remove undesirable materials therefrom. Accordingly, several such apparatus 10 may be located adjacent one another to form a larger, overall assembly wherein said apparatus provide sequential fluid treatment on a substrate moving through the assembly using the unique teachings herein.

While there have been shown and described what are at present considered the preferred embodiments of the invention, it will be obvious to those skilled in the art that various changes and modifications may be made therein without departing from the scope of the invention as defined by the appended claims.

What is claimed is:

1. A fluid treatment apparatus comprising:
   means for moving a substrate in a predetermined direction of travel;
   dam means located substantially adjacent a first surface of said moving substrate for collecting and maintaining a first fluid at a predetermined level above said first surface;
   a plurality of fluid nozzles positioned substantially adjacent said first surface of said substrate and within said collected first fluid below said predetermined level for directing a plurality of fluid jets of said first fluid through said collected first fluid and onto said first surface at spaced apart locations thereon, selected ones of said fluid nozzles being spaced apart from the nearest adjacent fluid nozzle such that the fluid jet from each of said selected ones of said fluid nozzles maintains a sufficient velocity across said first surface of said substrate to substantially prevent mixing of said directed fluid jet with said collected first fluid prior to engagement with the directed fluid jet from said nearest, adjacent fluid nozzle; and
   means for providing said first fluid at a pressure sufficient to maintain said fluid jets at said velocity across said first surface of said substrate.

2. The fluid treatment apparatus according to claim 1 wherein said fluid nozzles comprise a plurality of elongated pipes each including a plurality of apertures therein.

3. The fluid treatment apparatus according to claim 2 wherein said elongated pipes are oriented in a substantially parallel orientation, each of said pipes being oriented at an acute angle relative to said predetermined direction of travel of said substrate.

4. The fluid treatment apparatus according to claim 3 wherein said acute angle is within the range of from about ten degrees to about thirty degrees.

5. The fluid treatment apparatus according to claim 2 wherein selected ones of said apertures are each of a substantially cylindrical configuration, the axis of said selected ones of said apertures being substantially perpendicular to said first surface of said substrate.

6. The fluid treatment apparatus according to claim 2 further including at least one manifold, each of said elongated pipes being operatively connected to said manifold.

7. The fluid treatment apparatus according to claim 6 wherein the number of manifolds is two, each of said elongated pipes including an end portion being operatively connected to a respective one of said manifolds.

8. The fluid treatment apparatus according to claim 2 wherein said means for moving said substrate comprises a plurality of rollers for engaging said first surface of said substrate.

9. The fluid treatment apparatus according to claim 8 wherein said plurality of fluid nozzles are positioned substantially adjacent said first surface of said substrate in at least two spaced-apart groupings each including at least two of said elongated pipes therein, at least one of said rollers being located within the spacing between said two groupings and engaging said first surface of said substrate through said opening.

10. The fluid treatment apparatus according to claim 2 wherein said elongated pipes and said plurality of apertures are oriented such that said fluid jets are directed onto substantially the entire surface area of said first surface of said substrate.

11. The fluid treatment apparatus according to claim 1 further including a second plurality of fluid nozzles positioned substantially adjacent a second surface of said substrate substantially opposite said first surface for directing a second fluid onto said second surface at spaced-apart locations thereon, selected ones of said second plurality of fluid nozzles being spaced apart from the nearest, adjacent fluid nozzle of said second plurality of nozzles such that the fluid jets from each of said selected ones of said second plurality maintains a sufficient velocity across said second surface of said substrate to substantially prevent mixing of said directed fluid jets of said second fluid with the ambient about said second plurality of nozzles prior to engagement with the directed fluid jet from said nearest, adjacent fluid nozzle, and means for providing said second fluid at a pressure sufficient to maintain said fluid jets of said second fluid at said velocity across said second surface of said substrate.

12. The fluid treatment apparatus according to claim 11 wherein said first and second fluids are the same.

13. The fluid treatment apparatus according to claim 11 wherein said second plurality of fluid nozzles comprises a plurality of elongated pipes each including a plurality of apertures therein.

14. The fluid treatment apparatus according to claim 13 wherein said elongated pipes of said second plurality of fluid nozzles are oriented in a substantially parallel orientation, each of said pipes of said second plurality of fluid nozzles being oriented at an acute angle relative to said predetermined direction of travel of said substrate.

15. The fluid treatment apparatus according to claim 14 wherein said acute angle of said pipes of said second plurality of fluid nozzles is within the range of from about ten degrees to about thirty degrees.

16. The fluid treatment apparatus according to claim 13 wherein selected ones of said apertures of said second plurality of fluid nozzles are each of a substantially cylindrical configuration, the axis of said selected ones of said apertures of said second plurality of fluid nozzles being substantially perpendicular to said second surface of said substrate.

17. The fluid treatment apparatus according to claim 13 further including at least one manifold, each of said elongated pipes of said second plurality of fluid nozzles being operatively connected to said manifold.

18. The fluid treatment apparatus according to claim 17 wherein the number of manifolds is two, each of said elongated pipes of said second plurality of fluid nozzles including an end portion being operatively connected to a respective one of said manifolds.

19. The fluid treatment apparatus according to claim 13 wherein said means for moving said substrate comprises a plurality of rollers for engaging said second surface of said substrate.

20. The fluid treatment apparatus according to claim 19 wherein said second plurality of fluid nozzles is positioned substantially adjacent said second surface of said substrate in at least two spaced-apart groupings each including at least two of said elongated pipes therein, at least one of said rollers being located within the spacing between said two groupings and engaging said second surface of said substrate through said opening.

21. The fluid treatment apparatus according to claim 13 wherein said elongated pipes of said second plurality of fluid nozzles and said plurality of apertures therein are oriented such that said fluid jets are directed onto substantially the entire surface area of said second surface of said substrate.

22. The invention according to claim 1 wherein said fluid treatment apparatus is an etcher and said first fluid is an etchant.

23. The invention according to claim 22 wherein said substrate is comprised of copper and said etchant is comprised of cupric chloride.

24. A method of fluid treating a substrate, said method comprising:
  moving said substrate in a predetermined direction of travel;
  collecting a first fluid substantially adjacent a first surface of said moving substrate and maintaining said first fluid at a predetermined level above said first surface;
  directing a plurality of fluid jets of said first fluid through said collected first fluid onto said first surface of said moving substrate at spaced-apart locations thereon in such a manner that each of said directed fluid jets maintains a sufficient velocity across said first surface to substantially prevent mixing of said directed fluid jets with said collected first fluid prior to engagement with the nearest, adjacent directed fluid jet; and
  providing said first fluid at a pressure sufficient to maintain said fluid jets at said velocity across said first surface of said substrate.

25. The method according to claim 24 wherein said first fluid is an etchant.

26. The method according to claim 25 wherein said etchant is cupric chloride.

27. The method according to claim 25 wherein said substrate is moved in said predetermined direction of travel at a rate of from about twenty inches per minute to about 140 inches per minute.

28. The method according to claim 25 wherein said first fluid is provided at a pressure within the range of from about four pounds per square inch to about twenty pounds per square inch to thereby maintain said fluid jets at said velocity across said first surface.

29. The method according to claim 24 further including directing a plurality of fluid jets of a second fluid onto a second surface of said moving substrate substantially opposite said first surface at spaced-apart locations thereon in such a manner that each of said directed fluid jets of said second fluid onto said second surface maintains a sufficient velocity across said second surface to substantially prevent mixing of said directed fluid jets of said second fluid with the ambient about said directed fluid jets of said second fluid prior to engagement with the nearest, adjacent directed fluid jet.

30. The method according to claim 29 wherein said second fluid is an etchant.

31. The method according to claim 30 wherein said etchant is cupric chloride.

32. The method according to claim 30 wherein said substrate is moved in said predetermined direction of travel at a rate of from about twenty inches per minute to about 140 inches per minute.

33. The method according to claim 30 wherein said second fluid is provided at a pressure within the range of from about four pounds per square inch to about twenty pounds per square inch to thereby maintain said fluid jets of said second fluid at said velocity across said second surface.

* * * * *